United States Patent [19]

Narabu et al.

[11] Patent Number: 4,621,369
[45] Date of Patent: Nov. 4, 1986

[54] INPUT CIRCUIT FOR CHARGE TRANSFER DEVICE

[75] Inventors: Tadakuni Narabu, Atsugi; Takeo Hashimoto, Machida; Hideo Kanbe, Atsugi; Maki Sato, Sagamihara; Miaki Nakashio, Machida, all of Japan

[73] Assignee: Sony Corporation, Tokyo, Japan

[21] Appl. No.: 543,533

[22] Filed: Oct. 20, 1983

[30] Foreign Application Priority Data

Jan. 20, 1983 [JP] Japan ................................. 58-7548

[51] Int. Cl.$^4$ ........................................... G11C 19/28
[52] U.S. Cl. .................................... 377/60; 357/24
[58] Field of Search .................. 377/57, 60, 63, 105; 357/24

[56] References Cited

U.S. PATENT DOCUMENTS 3,623,132  11/1971  Greene .................................. 377/60
3,789,267  1/1974   Krambeck et al. .................... 307/304
4,093,872  6/1978   Hartman et al. ....................... 377/60
4,139,784  2/1979   Sauer ..................................... 377/63
4,140,923  2/1979   Herrmann .............................. 357/24
4,156,818  5/1979   Collins et al. ........................ 357/24
4,277,694  7/1981   Jensen .................................. 377/105

OTHER PUBLICATIONS

"Charge Transfer Devices" by Sequin et al., Academic Press, Jul. 28, 1975, pp. 24-27.

Primary Examiner—John S. Heyman
Assistant Examiner—Karl Ohralik
Attorney, Agent, or Firm—Hill, Van Santen, Steadman & Simpson

[57] ABSTRACT

An input circuit for a charge transfer device in which within a region of the input gate of its charge transfer element the potential barrier same as that in the transfer section thereof is provided and the same digital input signal is supplied to a pair of input gates.

4 Claims, 28 Drawing Figures

INPUT CIRCUIT FOR CHARGE TRANSFER DEVICE

BACKGROUND OF THE INVENTION

1. Field of the Invention

The present invention relates generally to input circuits and more particularly relates to an input circuit for a charge transfer device which is used as a shift register, a delay element, a memory and so on.

2. Description of the Prior Art

Figure 1:
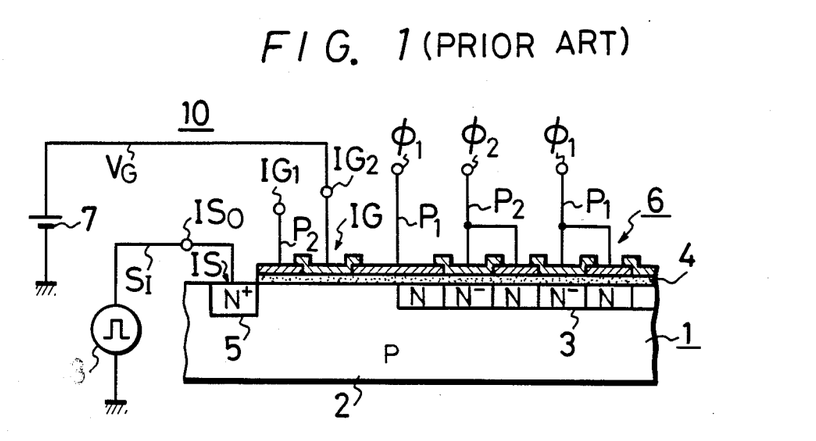
FIG. 1 is a constructional diagram showing an example of a conventional input circuit for a charge transfer device.

An example of a conventional input circuit including a CCD (charge coupled device) when the CCD is used as a charge transfer element is shown in FIG. 1.

The example of FIG. 1 is the case in which a 2-phase n-channel CCD 1 of buried channel type is used. In this case, under the surface of a P type substrate 2 is formed an N and N− type diffusion layer 3, while over the surface of the P type substrate 2 are alternately deposited transfer electrodes to which control signals $\phi_1$ and $\phi_2$ are applied through an insulating layer ($SiO_2$ layer or the like) 4. An N type diffusion layer 5 receives an input, and between layer 5 and a transfer area or section 6 are deposited input gates which are connected to terminals $IG_1$ and $IG_2$.

When an input signal (digital signal) is supplied to such CCD 1 according to a voltage input method, there is generally employed an input circuit 10 as, for example, shown in FIG. 1. More particularly, a transfer clock pulse $P_2$ as shown in FIG. 2C is supplied to the first input gate electrode terminal $IG_1$ and a fixed bias $V_G$ from a bias source 7 is supplied to the second input gate electrode terminal $IG_2$. Also, a digital input signal $S_I$ shown in FIG. 2A is supplied to the input source layers from a signal source 8.

Figure 2A:
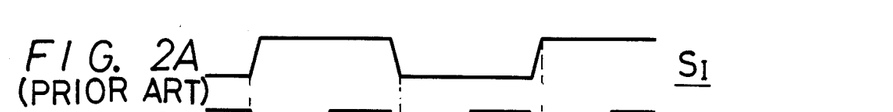
FIGS. 2A to 2C are respectively waveform diagrams showing a relation between a transfer clock and an input signal.
Figures 2B, 2C:
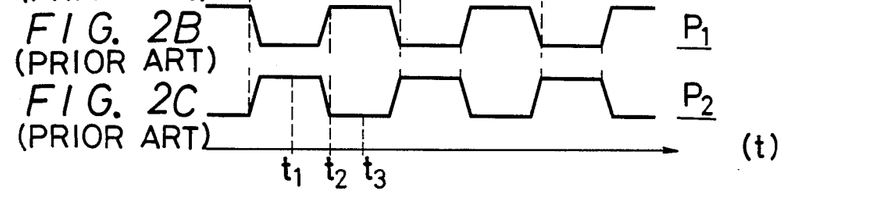

Accordingly, when the input signal $S_I$ (digital signal which alternately becomes "1" and "0" as shown in FIG. 2A) is taken in by the use of the transfer clocks (each having the frequency, for example, four times the subcarrier frequency) $P_1$ and $P_2$ shown in FIGS. 2B and 2C, a relation between potential wells (boundary surface potentials) formed by the transfer clocks $P_1$ and $P_2$ and the signal charge becomes as shown in FIG. 3.

Figure 3A:
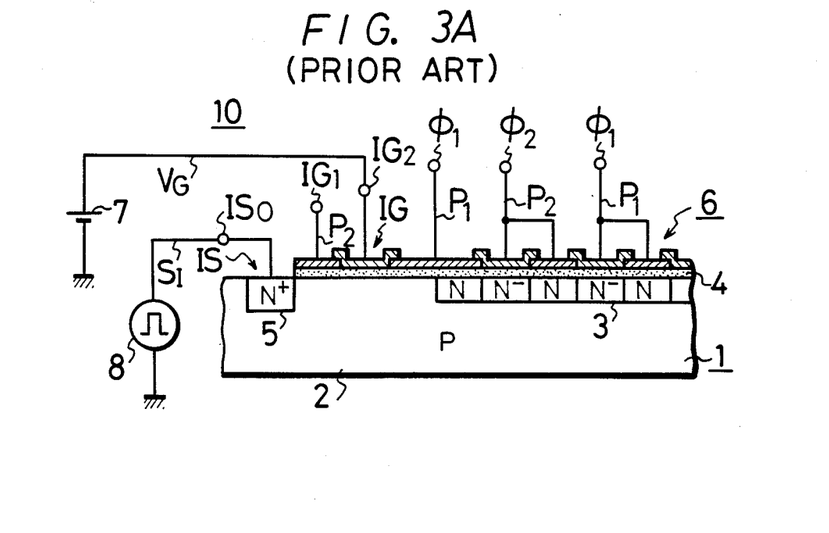
FIG. 3A and FIGS. 3B to 3D are respectively a constructional diagram of the input circuit and waveform diagrams used to explain the operation thereof.
Figure 3B:
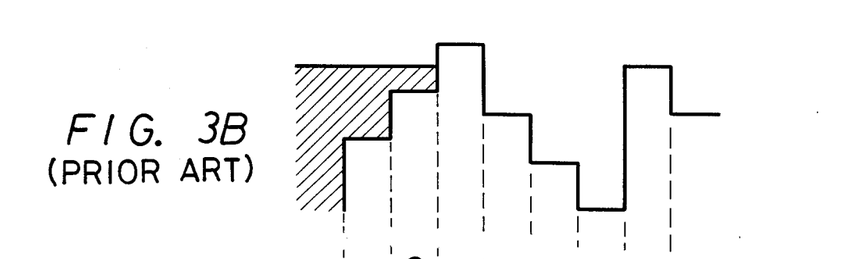
Figure 3C:
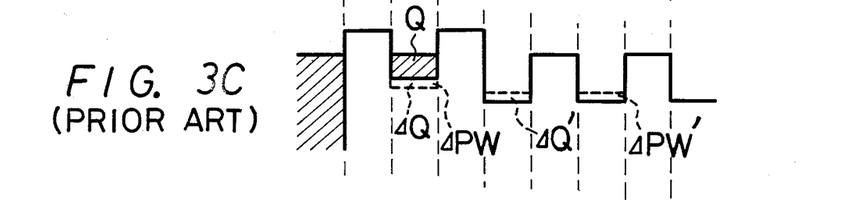
Figure 3D:
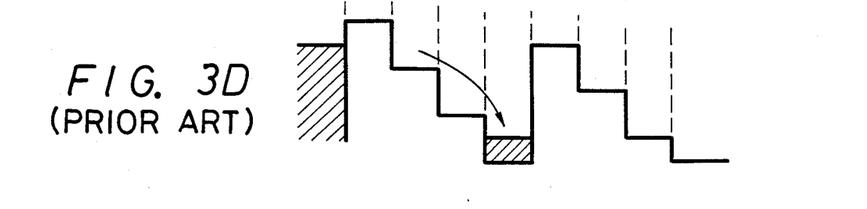

FIG. 3B shows such relation between the potential well and the signal charge at time point $t_1$ in FIG. 2. At time point $t_2$, the accumulation or taken-in of a signal charge Q (shown by hatched area) is completed (FIG. 3C) and then from time point $t_3$ the transfer of the signal charge Q is started (FIG. 3D).

The above potential well may sometimes be slightly displaced from a predetermined value due to scattering in the manufacturing process of the CCD 1. In this case, it is general that the displacement is different between the potential wells in the transfer section 6 and those at the input gate terminal IG. For example, when the potential well at the input gate terminal IG is displaced so as to become deeper by $\Delta PW$, the potential well in the transfer section 6 is displaced so as to become shallower by $\Delta PW'$ (not always equal to the $\Delta PW$) as shown in FIG. 3C. When the potential well is considerably scattered in the process treatment of the CCD 1, the signal charge Q may frequently be overflowed during the transfer mode.

The reason for this is as follows. In general, in order to raise the S/N (signal-to-noise) ratio, the signal charge Q is taken in by a charge amount immediately before being overflowed under the normal transfer state, so that when the potential well becomes shallow by $\Delta PW'$ as described above, although the taken-in charge amount is increased by $\Delta Q$, the transfer charge amount to be handled is decreased by $\Delta Q'$. As a result, the overflow of the signal charge Q is easily caused. The overflow of the signal charge causes a bit error to occur.

The overflow of the signal charge is caused by not only the scattering of the process treatment but also the fluctuation of the potential level due to the secular variation upon use and the fluctuation of the voltage $V_G$ which is supplied to the second input gate electrode terminal $IG_2$. That is, when, for example, the bias voltage $V_G$ is changed, the potential level is changed, increasing the depth of the potential well more than the predetermined value.

Figure 4A:
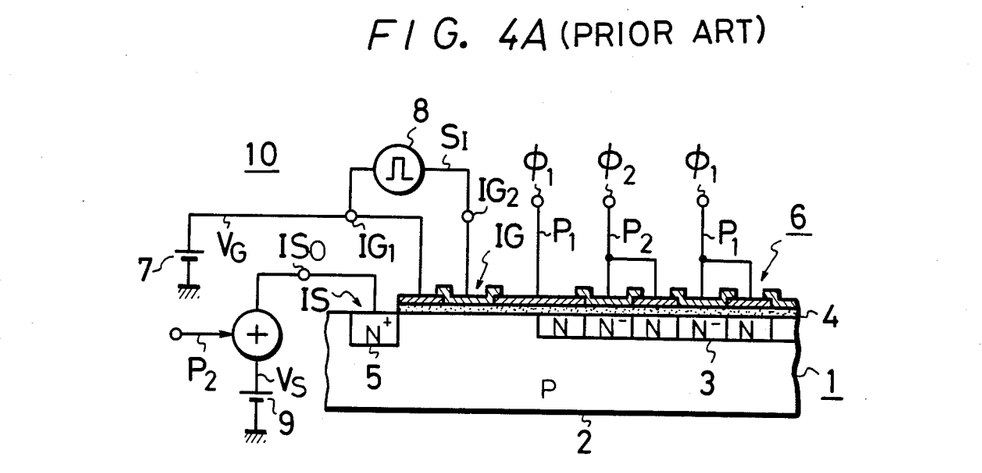
FIG. 4A is a constructional diagram showing another example of the conventional input circuit for a charge transfer device.
Figure 4B:
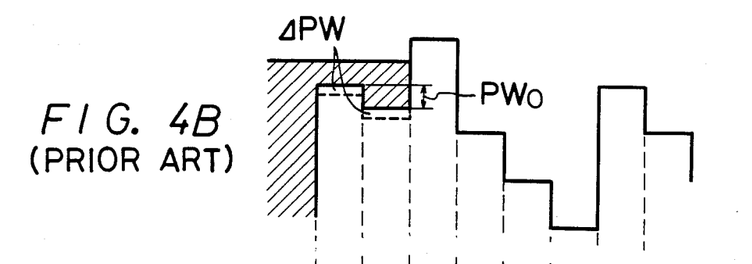
FIGS. 4B to 4D are respectively waveform diagrams used to explain the operation thereof.
Figure 4C:
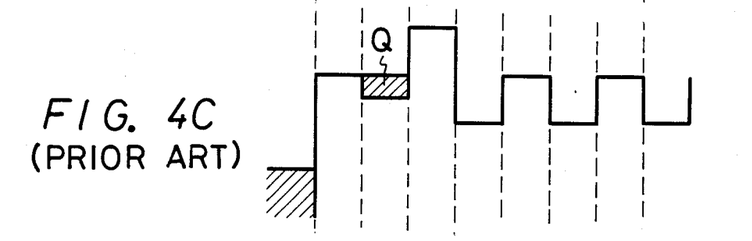
Figure 4D:
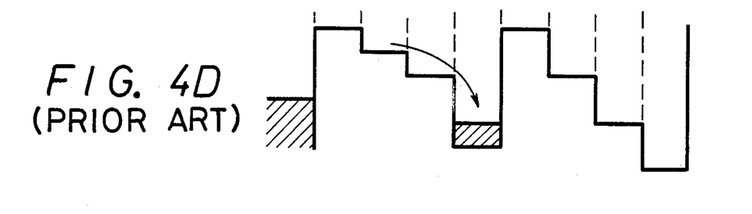

Such defect can be removed if the input signal is taken in with the charge preset input method. FIG. 4A shows an example of an input circuit 10 which carries out the above charge preset input method. FIGS. 4B to 4D are respectively diagrams used to explain a relation between a potential well and a signal charge in the same way as in FIG. 3.

In this example, an inverted transfer clock $\overline{P}_2$ biased by voltage $V_S$ from a bias source 9 is supplied to an input source electrode terminal $IS_0$ and a bias voltage $V_G$ is supplied to a first input gate electrode terminal $IG_1$. And, an input signal $S_I$ is supplied between the first input gate electode terminal $IG_1$ and a second input gate electrode terminal $IG_2$.

As a result, a depth $PW_0$ of the potential barrier formed within the region of the input gate IG, namely, potential well formed beneath the second input gate connected to electrode terminal $IG_2$ is determined by the magnitude of the level of the input signal $S_I$. Thus, when the scattering exists in the process treatment and therefore the potential level in the second input gate connected to electrode terminal $IG_2$ becomes deeper by $\Delta PW$, the potential level in the first input gate electrode $IG_1$ becomes deeper similarly by $\Delta PW$. In consequence, the depth $PW_0$ of the potential barrier within the input gate region, or the potential well does not change at all.

Therefore, the charge amount Q to be taken in the potential well in the second input gate connected to electrode terminal $IG_2$ is constant at all times. When the bias voltage $V_G$ is changed, the potential level in the first input gate connected to electrode terminal $IG_1$ is changed. In this case, however, the input signal $S_I$ is supplied between the first and second input gate through electrode terminals $IG_1$ and $IG_2$ so that a relative level difference therebetween is constant as long as the level of the input signal $S_I$ is constant. Thus, the depth $PW_0$ of the potential well is not changed by the bias voltage $V_G$.

As described above, if the input signal $S_I$ is taken in according to the charge preset input method, even when the process treatment is scattered and the bias voltage $V_G$ provided in the input circuit 10 is fluctuated, the signal charge amount Q to be taken in is not changed so that the probability of overflow is reduced significantly.

Figure 5:
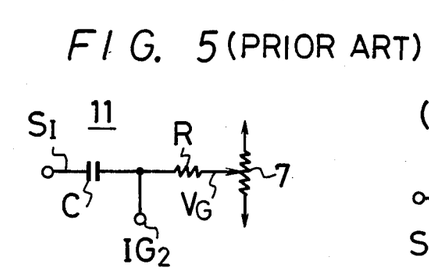
FIG. 5 is a diagram schematically showing an example of a mixer circuit to be used in the above conventional input circuit shown in FIG. 4A.

However, in this input circuit 10, when the input signal $S_I$ is superimposed upon the bias voltage $V_G$ and then applied to the second input gate connected to electrode terminal $IG_2$, a mixer 11 shown in FIG. 5 is used to couple the bias voltage $V_G$ with the input signal $S_I$. When the mixer 11 is employed, by the integral action of a coupling capacitor C and a resistor R used therein, the potential at the second input gate connected to electrode terminal $IG_2$ may sometimes be displaced to either $V_G$ or $V_G+V_I$ ($V_I$ represents the level of the input signal $S_I$).

Figure 6:
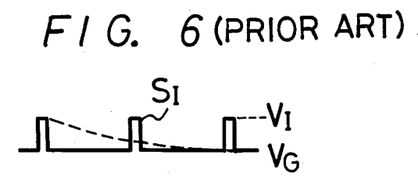
FIG. 6 is a diagram used to explain the operation of the above mixer circuit shown in FIG. 5.

The reason for this is that when, for example, "0" is inputted in succession in the signal series of the digital input signal $S_I$, the integral action of the coupling capacitor C and the resistor R causes the potential at the second input gate connected to electrode terminal $IG_2$ to become close to the bias voltage $V_G$ as shown in FIG. 6.

Figure 7:
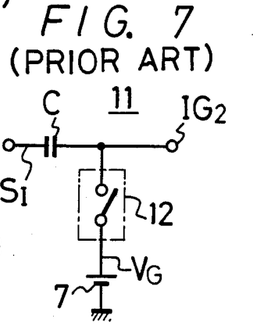
FIG. 7 is a diagram showing an example of a clamping circuit necessary for the conventional input circuit shown in FIG. 4A.

In consequence, the input circuit 10 shown in FIG. 4 inevitably requires a clamping circuit 12 shown in FIG. 7 and hence the construction of the input circuit 10 becomes complicated. Moreover, with the circuitry thus made, unless the fixed bias $V_S$ is applied to the first input gate connected to electrode terminals $IG_1$, the potential level as shown in FIG. 4B can not be obtained so that two bias sources 7 and 9 are indispensable therefor.

OBJECTS AND SUMMARY OF THE INVENTION

Accordingly, it is an object of the present invention to provide an improved input circuit for a charge transfer device.

It is another object of the present invention to provide an input circuit for a charge transfer device which can prevent both of the overflow and bit error from occurring even when the input charge amount is changed.

It is a further object of the present invention to provide an input circuit for a charge transfer device which can reduce the number of bias sources and which does not require a clamping circuit.

It is a still further object of the present invention to provide an input circuit for a charge transfer device which is suitable for use with a shift register, a delay element, a memory and so on.

According to one aspect of the present invention, there is provided an input circuit for a charge transfer device comprising:
means for producing in a region of an input gate of said charge transfer device a potential barrier same as that in a transfer section of said charge transfer device; and
means for supplying a digital input signal to said input gate.

The other objects, features and advantages of the present invention will become apparent from the following description taken in conjunction with the accompanying drawings through which the like references designate the same elements and parts.

DESCRIPTION OF THE PREFERRED EMBODIMENTS

Now, the present invention will be described in detail with reference to FIG. 8 and the following. In this case, 2-phase n-channel CCD of buried channel type is used as the charge transfer element similarly as above.

In this application, the drawings show in FIGS. 1, 3A, 4A, 8, 9A, 11 and 13 electrodes which are mounted adjacent to each other. It is to be realized that such electrodes are insulated from each other by a suitable insulating film so that they are electrically isolated.

Figure 8:
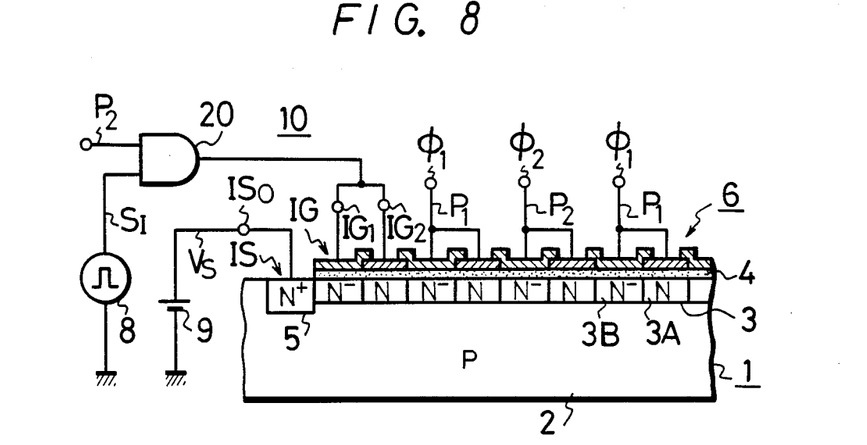
FIG. 8 is a conventional diagram showing an embodiment of an input circuit for a charge transfer device according to the present invention.

FIG. 8 shows an embodiment of an input circuit 10 according to the present invention in which a CCD 1 is included, too. In this embodiment, within the region of the input gate which is connected to terminal IG of the CCD 1 is also formed the same potential barrier as that of the transfer area or section 6. To this end, in this embodiment, the diffusion layer 3 which is provided at only the transfer section 6 in the prior art is also formed within the input gate IG in the same way as described above. Thus, an N and $N^-$ type diffusion layer 3 is formed as shown in FIG. 8.

Then, the input gate electrodes which are connected to terminals $IG_1$ and $IG_2$ are formed in the same way as the transfer electrodes $\phi_1$ and $\phi_2$. As a result, when a predetermined potential is applied to the input gate electrodes which are connected to terminal $IG_1$ and $IG_2$, within the region of the input gate IG appears the potential barrier same as that of the transfer section 6. An example of the potential barrier is shown in FIG. 9B.

In the input circuit 10, a predetermined DC bias voltage $V_S$ is applied to the input source electrode terminal $IS_0$ from the bias source 9, while a logical AND output between the digital input signal $S_I$ and the transfer clock is supplied common to the first and second input gate electrodes which are connected to terminals $IG_1$ and $IG_2$. As the transfer clock to be operated in the function of logical AND, there is employed a transfer clock different from the transfer clock which is supplied to the transfer electrode $\phi_1$ adjoining the input gate IG. Accordingly, in the case, the other transfer clock $P_2$ is supplied to an AND circuit 20.

Figure 9A:
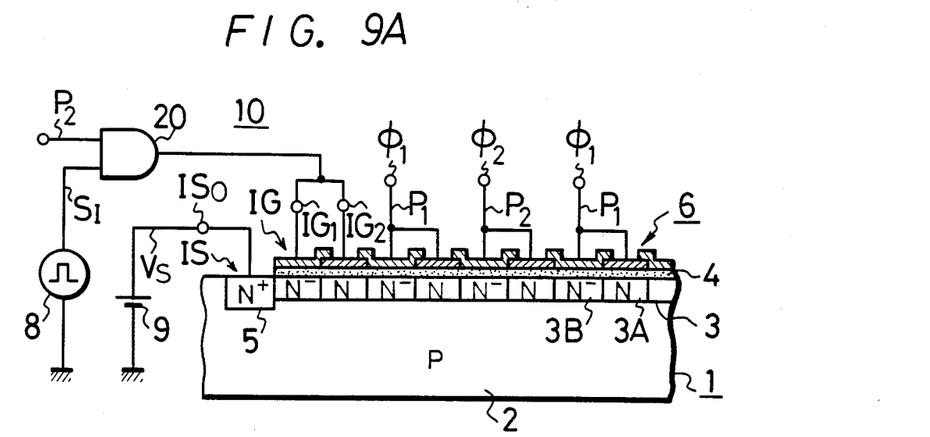
FIG. 9A is a constructional diagram similar to that of FIG. 8 and FIGS. 9B to 9E are respectively waveform diagrams used to explain the operation thereof.
Figure 9B:
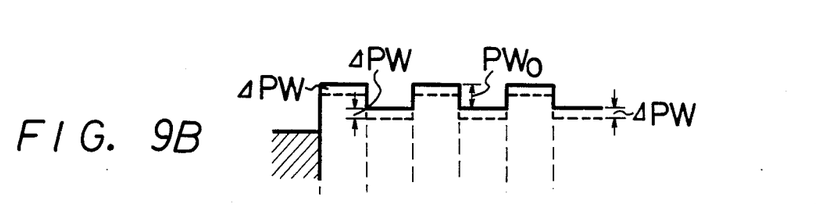
Figure 9C:
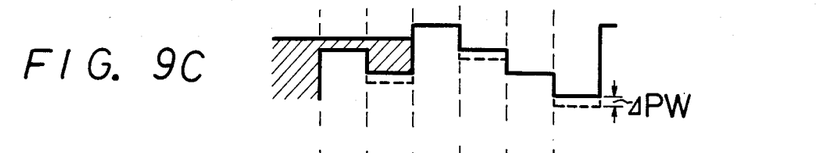
Figure 9D:
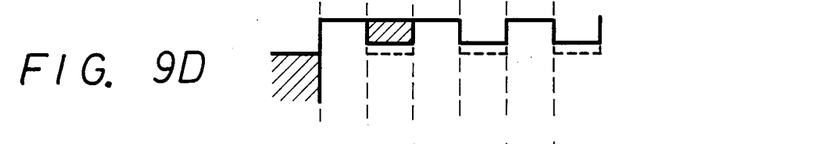
Figure 9E:
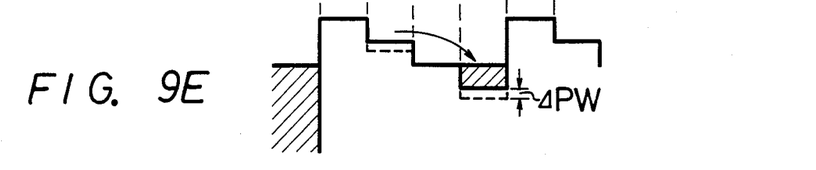
Figure 10A:
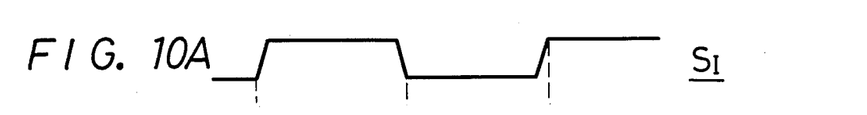
FIGS. 10A to 10C are respectively waveform diagrams useful for explaining the same.
Figure 10B:
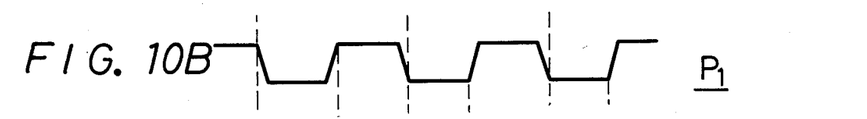
Figure 10C:
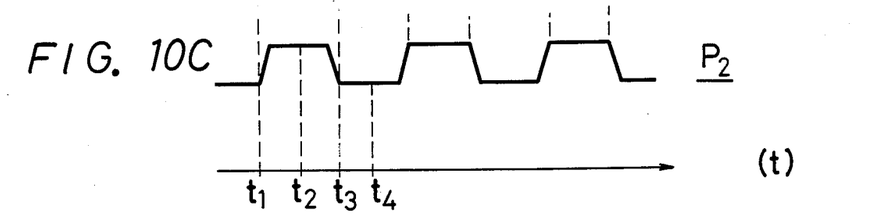

FIGS. 9B to 9E show the relationship between the potential well and the signal charge at respective times $t_1$ to $t_4$ in FIGS. 10A to 10C, respectively. When no input signal is applied, namely, at time $t_1$, the relation becomes as shown in FIG. 9B. At time $t_2$, the input signal $S_I$ is applied in common to the input gate electrode terminals $IG_1$ and $IG_2$ so that the signal charge Q is taken in the potential well provided just under the second input gate electrode which is connected to terminal $IG_2$ (FIG. 9C). At time point $t_3$, the input signal $S_I$ is interrupted by the gate circuit 20 so that the signal charge Q remains only in the potential well provided just under the second input gate electrode connected to terminal $IG_2$. Thus, the taken-in of the signal charge Q is completed (FIG. 9D).

After time $t_4$ the transfer mode of the signal charge Q as shown in FIG. 9E occurs.

The depth $PW_0$ of the potential barrier obtained in each region of the input gate IG and the transfer section 6, namely, the potential well is determined by the impurity concentration difference between an N type diffusion layer 3A and an $N^-$ type diffusion layer 3B. Moreover, since the same diffusion layer 3 as that of the transfer section 6 is formed in the input gate IG also, the influence of the scattering in the process treatment appears the same in both of them. In consequence, although the taken-in amount of the signal charge is changed by $\pm \Delta Q$, the signal charge amount to be taken in the potential well within the transfer section 6 is changed by $\pm \Delta WQ$, also so that no overflow occurs in the transfer section 6, thus causing no bit errors.

In use, the potential level may sometimes be changed due to secular variation. Also in this case, the potential level changes all appear uniformly (as, for example, shown in FIG. 9B, the potential level changes by $\Delta PW$ in the same direction at a time) so that in this case, the signal charge amount to be taken in does not change. Even if the voltage $V_S$ changes more or less, the signal charge amount to be taken in barely changes.

For these reasons, it never occurs that upon transfer of the signal charge, the overflow occurs due to inner and outer causes and thereby the bit error does not occur.

According to the above input circuit 10, since the potential barrier is formed within the region of the input gate IG, it is not necessary that this potential barrier is formed by the external bias source as in the prior art. Therefore, only the charge preset bias source 9 for the input source layer IS is required so that the number of the bias sources can be reduced.

And, the input signal $S_I$ is supplied in common to the input gate electrode terminals $IG_1$ and $IG_2$ and by only the input signal $S_I$ the potential level of the first input gate electrode terminal $IG_1$ can be shifted, namely, the first input gate electrode terminal $IG_1$ can be turned on and off so that the DC level of the input signal $S_I$ can directly be supplied to the input gate electrodes which have terminals $IG_1$ and $IG_2$. Therefore, the DC level of the input signal $S_I$, and accordingly the output DC level of the AND circuit 20 becomes compatible in TTL (transistor-transistor logic) manner with the input level of the input gate electrodes which are connected to terminals $IG_1$ and $IG_2$ in the CCD 1. Thus, it is not necessary that as in the prior art, the input signal $S_I$ is put into capacitive coupling, this input signal $S_I$ is converted into the TTL level and then supplied to the input gate electrodes connected to terminals $IG_1$ and $IG_2$. As a result, it is possible to omit the clamping circuit which operates for converting the level.

Figure 11:
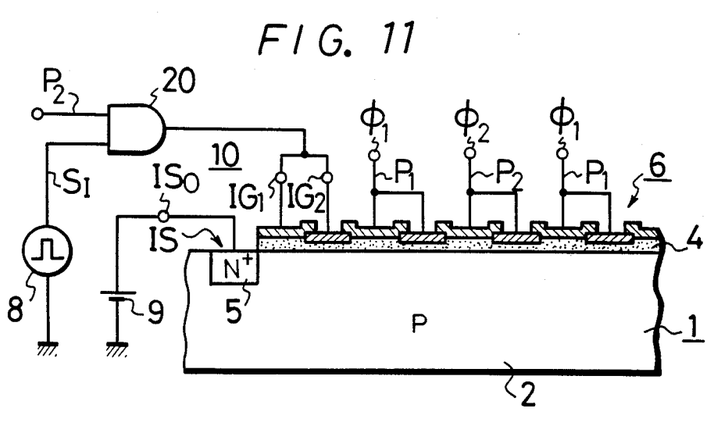
FIGS. 11 and 13 are respectively constructional diagrams showing further embodiments of the present invention.

FIG. 11 shows another embodiment of the input circuit for a charge transfer device according to the present invention. FIG. 11 is a case where the present invention is applied to a 2-phase n-channel CCD 1 of a surface channel type. In this case, in order that the same potential barrier as that of the transfer section 6 may be formed within the region of the input gate IG, the electrodes which are connected to terminals $IG_1$ and $IG_2$ having the same constructions as the transfer electrodes $\phi_1$ and $\phi_2$ are deposited on an insulating layer 4. Therefore, in this embodiment, the thickness of the insulating layer 4 beneath the electrode which is connected to terminal $IG_1$ is selected larger than that beneath the electrode which is connected to terminal $IG_2$.

Figure 12:
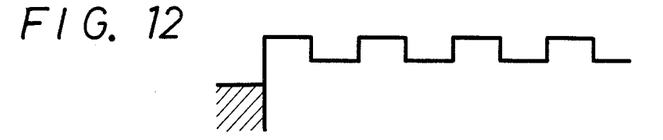
FIGS. 12 and 14 are respectively diagrams used to explain the potential barrier thereof.

As described above, with the same electrode structures as those in the transfer section 6, the same potential barrier as that in the transfer section 6 is formed within the region of the input gate IG (see FIG. 12) so that the influence due to the scattering in the process treatment and also the fluctuation of the external bias source can be avoided and the overflow upon use can surely be removed. Furthermore, even when the input circuit of the present invention is constructed as mentioned just above, the input circuit having the construction shown in FIG. 8 can be used as the input circuit 10 so that the number of the bias sources can be reduced and the clamping circuit can be omitted.

Figure 13:
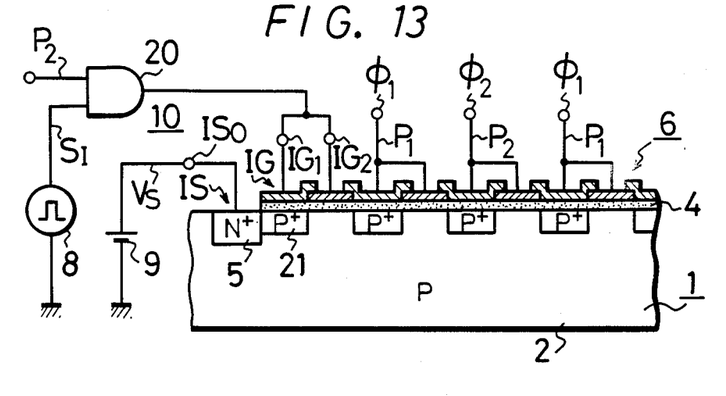
Figure 14:
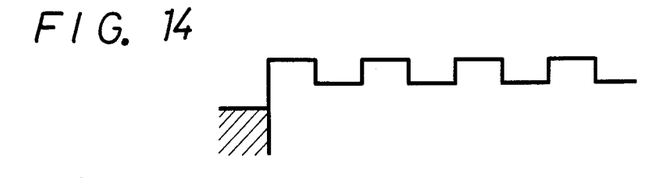

FIG. 13 illustrates a further embodiment of the invention in which the CCD 1 of the same surface channel type as mentioned above is used. In this case, the present invention is applied to the CCD 1 in which a predetermined potential barrier is formed by a $P^+$ type diffusion layer 21 formed in a P type substrate 2. Also in this case, the $P^+$ type diffusion layer 21 is formed in the region of the input gate IG so that as shown in FIG. 14, the same potential barrier as that in the transfer section 6 is formed and thus the same action and effect as above can be achieved.

While in the above embodiments the present invention is applied to the input circuit for the 2-phase n-channel CCD, it is needless to say that the input circuit of the present invention can be applied to an m-phase n-channel CCD, a m-phase P-channel CCD and other charge transfer elements.

As described above, according to the present invention, even by the scattering of the process treatment, the fluctuation of the external bias source provided in the input circuit 10, the fluctuation of the potential level caused by the secular variation or the like, the signal charge in the transfer mode is not overflowed so that no bit error occurs.

Furthermore, since in addition to the above construction the input signal $S_I$ is supplied in common to the input gate electrodes which are connected to terminals $IG_1$ and $IG_2$, the number of the external bias sources can be decreased and the clamping circuit can be omitted.

Thus, the present invention is particularly suitable for use with input circuits for various shift registers, memories and so on.

The above description is given for the preferred embodiments of the invention, but it will be apparent that many modifications and variations could be effected by one skilled in the art without departing from the spirit or scope of the novel concepts of the invention, so that the scope of the invention should be determined by the appended claim only.

We claim as our invention:

1. A charge coupled circuit wherein the potential barrier in the input gates is the same as in the transfer gates comprising a substrate of a first conductivity type, a layer of opposite conductivity type formed in the surface of said substrate, a plurality of transfer gates formed over said layer of opposite conductivity type and a plurality of transfer voltages alternately supplied to said transfer gates, a pair of adjacent input gates formed over a portion of said opposite conductivity type and the same variable input signal applied thereto, and an input region of opposite conductivity type formed in said substrate adjacent said pair of adjacent input gates.

2. A charge coupled device according to claim 1 wherein said layer of opposite conductivity type comprises alternate N− and N regions.

3. A charge coupled circuit wherein the potential barrier in the input gates is the same as in the transfer gates comprising a substrate of a first conductivity type, an insulating layer of alternating thicker portions and thinner portions formed on said substrate, a first plurality of transfer gates formed on said thicker portions and a second plurality of transfer gates formed on said thinner portions of said insulating layer, transfer voltages applied to said thicker portions and to said thinner portions with the same transfer voltage applied to one of said plurality of thicker portions and to one of said plurality of thinner portions, an input region of opposite conductivity type formed in said substrate and an input signal supplied thereto, and a pair of input gates formed on said insulating layer between said input region and said first and second plurality of transfer gates and the same variable input switching signals supplied thereto.

4. A charge coupled circuit wherein the potential barrier in the input gates is the same as in the transfer gates, comprising a substrate of a first conductivity type, a plurality of spaced regions of the same conductivity type formed in the surface of said substrate and having a higher impurity concentration than said substrate, a plurality of pairs of transfer gates formed on said substrate with one of each pair of said pairs of transfer gates formed over said spaced regions, a plurality of transfer voltages alternately applied to said pairs of transfer gates, a pair of adjacent input gates formed on said substrate with the first one of said pair of adjacent input gates formed over one of said plurality of spaced region and the same variable input signal applied to said pair of adjacent input gates, and an input region of opposite conductivity type formed in said substrate adjacent said pair of adjacent input gates.

* * * * *